US006292065B1

(12) United States Patent
Friedman et al.

(10) Patent No.: US 6,292,065 B1
(45) Date of Patent: Sep. 18, 2001

(54) DIFFERENTIAL CONTROL TOPOLOGY FOR LC VCO

(75) Inventors: Daniel Joseph Friedman, Tarrytown, NY (US); Mounir Meghelli, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/574,089

(22) Filed: May 18, 2000

Related U.S. Application Data
(60) Provisional application No. 60/178,446, filed on Jan. 27, 2000.

(51) Int. Cl.[7] .................................................. H03B 5/12
(52) U.S. Cl. ............................ 331/117 R; 331/36 C; 331/177 V
(58) Field of Search .................... 331/117 R, 117 FE, 331/177 V, 36 C

(56) References Cited

U.S. PATENT DOCUMENTS

| | | | |
|---|---|---|---|
| 5,422,603 | * | 6/1995 | Soyuer ................................. 331/1 A |
| 5,434,545 | * | 7/1995 | Burchfield ........................... 331/1 A |
| 5,781,048 | * | 7/1998 | Nakao et al. ........................ 331/17 |

OTHER PUBLICATIONS

Li Lin et al., "A 1.4GHz Differential Low–Noise CMOS Frequency Synthesizer Using a Wideband PLL Architecture" 2000 IEEE SSCC Session 12/Frequency Synthesizers & Dividers/Paper TP 12.5 pp. 204–205 Feb. 8, 2000.

Nguyen et al., "A 1.8–GHzMonolithic LC Voltage–Controlled Oscillator", IEEE Journal of Solid State Circuits, vol. 27, #3,3/92 pp. 444–450.

Gutierrez et al., "2.488 Gb/s Silicon Bipolar Clock and Data Recovery IC for Sonet (OC–48)" IEEE 1998 Custom Integrated Circuits Conference, AMCC, San Diego, CA pp. 575–578.

* cited by examiner

Primary Examiner—Siegfried H. Grimm
(74) Attorney, Agent, or Firm—Paul J. Otterstedt

(57) ABSTRACT

The LC VCO includes an LC oscillator module with first and second tank nodes and a control module with positive and negative input voltage terminals. The control module includes four voltage dependent capacitive elements which are configured to be biased for operation as voltage dependent variable capacitances. The voltage dependent capacitive elements are interconnected such that the effect of a common mode input voltage is to increase the capacitance of two of the voltage dependent capacitive elements, while simultaneously decreasing the capacitance of two of the other voltage dependent capacitive elements by a substantially similar amount, such that a differential voltage applied across the positive and negative input voltage terminals is operable to change the capacitance of the voltage dependent capacitive elements, and thereby the frequency of the LC oscillator module, while effects on the output frequency of the oscillator caused by a common mode voltage tend to cancel. Accordingly, a fully differential signal path in phase locked loops employing LC oscillators, with improved noise rejection, substantial suppression of common mode noise, and a minimal increase in complexity over a single-ended control design can be achieved. Additional supply voltages need not be employed.

8 Claims, 7 Drawing Sheets

DIFFERENTIAL CONTROL TOPOLOGY FOR LC VCO

CROSS-REFERENCE TO RELATED APPLICATION

This application claims the benefit of U.S. Provisional Application No. 60/178,446 filed Jan. 27, 2000.

BACKGROUND OF THE INVENTION

1. Field of the Invention

The present invention relates to the electronic arts, and more particularly relates to a voltage controlled oscillator suitable for phase locked loop circuits such as may be employed in a high speed data communication link.

2. Brief Description of the Prior Art

Phase locked loops are important in the field of high speed data communication. They are employed in clock multiplier circuits, in which one or more high frequency output clocks are synthesized from a reference input. They are also used in clock and data recovery (CDR) circuits, in which the clock and data are recovered from a single high-speed serial stream of non-return to zero (NRZ) data. In systems which employ phase locked loop (PLL) circuits, the precision of the generated or recovered clock is critical to the performance of the system. Noise sensitivity of the components of the PLL can limit the quality of the generated or recovered clock, and may thus limit system performance. Clock multiplier circuits are used in conjunction with CDR circuits in local area networks, long-haul backbone networks, and/or wide area networks. Ethernet, Fibre Channel, and SONET/SDH) transmission systems are specific examples of systems which rely on PLL-based CDR circuits and clock multipliers. Furthermore, clock multiplier circuits are frequently found in microprocessors (where they are employed to generate the on-chip clock) and in radio frequency (RF) wireless communication systems (where they are used to synthesize carrier frequencies as needed).

A key component of a PLL is the oscillator. In a typical PLL, a voltage controlled oscillator (VCO) is phase locked to an input signal. The VCO oscillation frequency is set by the control voltage input to the VCO. The action of the PLL adjusts the control voltage, thus changing the VCO oscillation frequency, as the attempt is made to achieve phase lock. A number of different oscillator topologies are used in PLLs, but three of the most common are multivibrators, ring VCOs, and LC VCOs. Inductive-capacitive (LC) VCOs are often preferred over other topologies because of the superior phase noise performance and frequency stability which they exhibit. In an LC VCO, the control input acts to modify the capacitance in the LC portion of the circuit. Because the oscillator frequency is proportional to the inverse square root of the product of L and C, changing the capacitance in the LC circuit changes the VCO oscillation frequency. The control input acts on a circuit element that has a voltage-dependent capacitance. Commonly, this circuit element can be a varactor, but any circuit element having a voltage-dependent capacitance can be employed.

In many PLL applications, and particularly in data communications PLL applications, noise is an extremely important design concern. For a PLL, noise is typically quantified by measuring the jitter of the PLL output. Noise which couples into any part of the PLL will degrade the jitter performance of the loop, so low-noise design techniques are an integral part of virtually any PLL design. One such design technique involves making the signal path through the PLL differential, in order to suppress common mode noise. In the case of LC VCO-based PLL designs, however, the VCO control itself is typically implemented as single-ended.

In the prior art, there have been several LC VCOs designed for PLLs with pseudo-differential control inputs. One such LC VCO is discussed in the article by Gutierrez et al. entitled "2.488 Gb/s Silicon Bipolar Clock and Data Recovery IC for SONET (OC-48)," as archived in the proceedings of the IEEE Custom Integrated Circuits Conference at pages 575–578. In the approach of Gutierrez et al., the VCO control does not affect the LC tank itself, but instead modifies the current of emitter followers which are placed in the LC VCO's feedback circuit. This effectively adds an active delay stage to the LC VCO, thus degrading the circuit's low-noise properties. A second approach is described in an article by Nguyen and Meyer entitled "A 1.8-GHz Monolithic LC Voltage-Controlled Oscillator," as published in the IEEE Journal of Solid-State Circuits, Volume 27, Number 3, in March 1992 at pages 444–450. In the approach of Nguyen and Meyer, two LC circuit outputs are mixed, in much the way as a delay interpolating ring VCO frequency is adjusted. In order for this approach to be fully differential, 4 LC circuits are effectively required, two LC circuits were used in the pseudo-differential approach as described in the Nguyen and Meyer paper.

The prior art approaches described to date do not implement full differential control. Furthermore, they do not properly treat the biasing of the voltage dependent capacitive elements which are used to set the VCO operating frequency.

In view of the foregoing, there is a need in the prior art for an LC VCO in which full differential control is implemented. Furthermore, there is the need for such an LC VCO which properly treats the biasing of the voltage dependent capacitive elements which are used to set the VCO operating frequency.

SUMMARY OF THE INVENTION

The present invention, which addresses the needs identified in the prior art, provides an LC VCO having an LC oscillator module with first and second tank nodes and a control module with positive and negative input voltage terminals. The control module includes first, second, third and fourth voltage dependent capacitive elements (VDCEs) each having a positive and a negative VDCE terminal. Each VDCE is configured to be biased for operation as a voltage-dependent variable capacitance.

The positive terminal of the first VDCE is coupled to the negative input voltage terminal, while one of the positive and negative terminals of the first VDCE is capacitively coupled to the second tank node. The positive terminal of the second VDCE is coupled to the negative input voltage terminal, while one of the positive and negative terminals of the second VDCE is capacitively coupled to the first tank node. The negative terminal of the third VDCE is coupled to the positive input voltage terminal, and one of the positive and negative terminals of the third VDCE is capacitively coupled to the second tank node. The negative terminal of the fourth VDCE is coupled to the positive input voltage terminal, and one of the positive and negative terminals of the fourth VDCF is capacitively coupled to the first tank node.

A diffrential voltage applied across the positive and negative input voltage terminals is operable to change capacitive properties of the VDCEs, so as to vary the output frequency of the LC oscillator module. Any effect on the output frequency of a common mode voltage applied to the positive and negative input voltage terminals tends to cancel.

In a preferred embodiment, the VDCEs are varactor diodes which are resistively biased. In other embodiments, the VDCEs can be, for example, field effect transistors (FETs), having a gate which functions as one terminal and a drain and source which are shorted together to function as another terminal.

These and other features and advantages of the present invention will be appreciated by reading the following specification, taken in conjunction with the accompanying drawings, and the scope of the invention will be set forth in the appended claims.

DETAILED DESCRIPTION OF THE INVENTION

Figure 1:
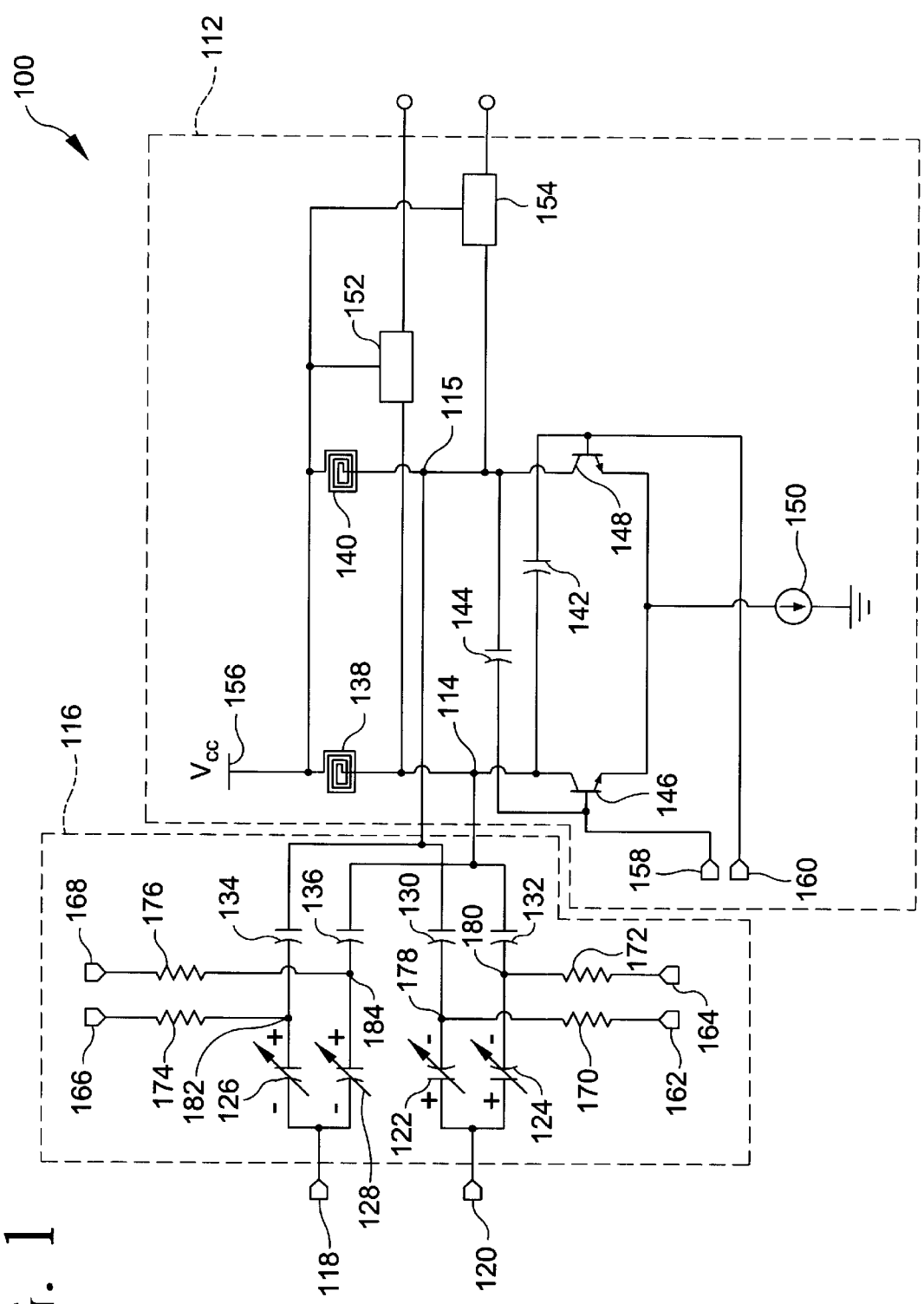
FIG. 1 is a circuit diagram of an LC VCO in accordance with the present invention.

Reference should now be had to FIG. 1 which depicts a circuit diagram of an inductive-capacitive (LC) voltage controlled oscillator (VCO), designated generally as 100, in accordance with the present invention. LC VCO 100 includes an LC oscillator module 112 and a control module 116. The LC oscillator module 112 has first and second tank nodes 114, 115. The control module 116 has positive and negative input voltage terminals 118, 120 respectively.

The control module 116 in turn comprises first, second, third and fourth voltage dependent capacitive elements (VDCEs).

As shown in FIG. 1, each VDCE has a positive and negative VDCE terminal which is indicated by the "plus" or "minus" sign in FIG. 1 and is not separately numbered. The positive terminal of the first VDCE 122 is coupled to the negative input voltage terminal 120. As used herein, "coupled" or "coupling" includes both direct coupling, or coupling through another circuit element. One of the positive and negative terminals of the first VDCE 122 is capacitively coupled to the second tank node 115 through first coupling capacitor 130. In the embodiment depicted in FIG. 1, it is the negative terminal of the first VDCE 122 which is capacitively coupled to the second tank node 115. All of the VDCEs 122, 124, 126 and 128 are configured to be biased for operation as voltage-dependent variable capacitances. Further details regarding biasing of the VDCEs will be provided below.

The positive terminal of the second VDCE 124 is coupled to the negative input voltage terminal 120, while one of the positive and negative terminals of the second VDCE 124 is capacitively coupled to the first tank node 114 through second coupling capacitor 132. In the embodiment depicted in FIG. 1, it is the negative terminal of second VDCE 124 which is capacitively coupled to first tank node 114.

The negative terminal of the third VDCE 126 is coupled to the positive input voltage terminal 118, while one of the positive and negative terminals of the third VDCE 126 is capacitively coupled to the second tank node 115 through third coupling capacitor 134. In the embodiment depicted in FIG. 1, it is the positive terminal of third VDCE 126 which is coupled to second tank node 115. Finally, the negative terminal of fourth VDCE 128 is coupled to the positive input voltage terminal 118, while one of the positive and negative terminals of the fourth VDCE 128 is capacitively coupled to the first tank node 114 through fourth coupling capacitor 136. In the embodiment shown in FIG. 1, it is the positive terminal of fourth VDCE 128 which is coupled to first tank node 114.

A differential voltage applied across the positive and negative input voltage terminals 118, 120 respectively is operable to change the capacitive properties of the VDCEs 122, 124, 126 and 128, so as to vary the output frequency $f_0$ of the LC oscillator module 112. However, if a common mode voltage is applied to the positive and negative input voltage terminals 118, 120, its effects on the output frequency $f_0$ will tend to cancel.

Still with reference to FIG. 1, details regarding the LC oscillator module 112 will now be presented. It is to be understood that numerous types of LC oscillators are known in the art, and the present invention can be employed with any LC oscillator module having first and second tank nodes. The configuration of LC oscillator module 112 which is depicted in FIG. 1 is but one example of many configurations which can be employed with the present invention, and has been found to be desirable for use in the present invention.

LC oscillator module 112 includes first and second inductors 138, 140. LC oscillator module 112 further includes first and second feedback capacitors 142, 144; first and second feedback transistors 146 and 148, and current source 150. LC oscillator module 112 can also, if desired, include optional first and second output components 152, 154, which can be, for example, resistive or capacitive dividers. Such optional output components may be used to attenuate high voltages in the tank circuit of oscillator module 112, which can enhance its utility for emitter coupled logic (ECL) type circuits.

A first terminal of inductor 138 is connected to power supply node 156 ($V_{cc}$) while a second terminal of inductor 138 is connected to the first internal tank node 114. A first terminal of second inductor 140 is also connected to power supply node 156, while the second terminal of inductor 140 is connected to the second internal tank node 115. A first terminal of first capacitor 142 is connected to the first internal tank node 114, while the second terminal of capacitor 142 is connected to the base of second transistor 148. In the exemplary embodiment shown in FIG. 1, second transistor 148 is a BJT having an npn configuration. A first terminal of second capacitor 144 is connected to the second internal tank node 115, while a second terminal of capacitor 144 is connected to the base of transistor 146, which is also shown in the exemplary embodiment as a BJT having an npn configuration.

The collector of the second transistor 148 is connected to the second internal tank node 115, while the emitter of transistor 148 is connected to the first terminal of the current source 150. The collector of the first transistor 146 is connected to the first internal tank node 114, while the emitter of transistor 146 is connected to the first terminal of the current source 150. The bases of transistors 146, 148 are connected to appropriate first and second BJT DC bias voltage terminals 158, 160 respectively. Other appropriate ways of biasing transistors 146, 148 can also be employed. Further, any suitable implementation of a current source can be employed for the current source 150. The second terminal of the current source 150 can be connected, for example, to ground as shown in FIG. 1.

Still with reference to FIG. 1, the control module 116 can further include first, second, third and fourth biasing voltage terminals 162, 164, 166 and 168 respectively. Additionally, control module 116 can yet further include first, second, third and fourth resistors 170, 172, 174 and 176 respectively. The negative terminal of the first VDCE 122 can be coupled to the first biasing voltage terminal 162, while the first VDCE 122 and the first resistor 170 can be connected at a first interconnection node 178. The first VDCE 122 and the first resistor 170 can form a first end-to-end coupled RC pair between the negative input voltage terminal 120 and the first biasing voltage terminal 162. As used herein, "end-to-end coupled RC pair" refers to an interconnection of a resistive element and a capacitive element wherein one terminal of one element is connected to one terminal of the other element, without the other terminals being connected to each other. Further, as used herein, "end-to-end coupled RC pair" is intended to apply to a case when a terminal of another device is also connected to the interconnected terminals of the resistive and capacitive elements. As shown in FIG. 1, the first interconnection node 178 can include the one of the positive and negative terminals (in this case, the negative terminal) of the first VDCE 122 which is capacitively coupled through first coupling capacitor 130 to the second tank node 115.

Still with reference to FIG. 1, the negative terminal of the second VDCE 124 can be coupled to the second biasing voltage terminal 164 and the second VDCE 124 and second resistor 172 can be connected at a second interconnection node 180. Second VDCE 124 and second resistor 172 can form a second end-to-end coupled RC pair between the negative input voltage terminal 120 and the second biasing voltage terminal 164, with the second interconnection node 180 including the one of the positive and negative terminals of the second VDCE 124 (in this case, the negative terminal) which is capacitively coupled to the first tank node 114 through the second coupling capacitor 132.

The positive terminal of the third VDCE 126 can be coupled to the third biasing voltage terminal 166 and the third VDCE 126 and third resistor 174 can be connected together at a third interconnection node 182. Third VDCE 126 and third resistor 174 can form a third end-to-end coupled RC pair between the positive input voltage terminal 118 and the third biasing voltage terminal 166, with the third interconnection node 182 including the one of the positive and negative terminals of the third VDCE 126 which is capacitively coupled to the second tank node 115 through the third coupling capacitor 134.

Finally, the positive terminal of the fourth VDCE 128 can be coupled to the fourth biasing voltage terminal 168 and the fourth VDCE 128 and fourth resistor 168 can be connected at a fourth interconnection node 184. Fourth VDCE 128 and fourth resistor 176 can form a fourth end-to-end coupled RC pair between the positive input voltage terminal 118 and the fourth biasing voltage terminal 168, and the fourth interconnection node 184 can include the one of the positive and negative terminals of the fourth VDCE 128 (here, positive terminal) which is capacitively coupled to the first tank node 114 through the fourth coupling capacitor 136.

As noted, the first interconnection node 178 can include the negative terminal of the first VDCE 122, the second interconnection node 180 can include the negative terminal of the second VDCE 124, the third interconnection node 182 can include the positive terminal of the third VDCE 126, and the fourth interconnection node 184 can include the positive terminal of the fourth VDCE 128. As will be discussed below, in alternative embodiments of the present invention, the first and second interconnection nodes 178, 180 can include the positive terminals of the first and second VDCEs 122, 124; and the third and fourth interconnection nodes 182, 184 can include the negative terminals of the third and fourth VDCEs 126, 128.

Figure 2:
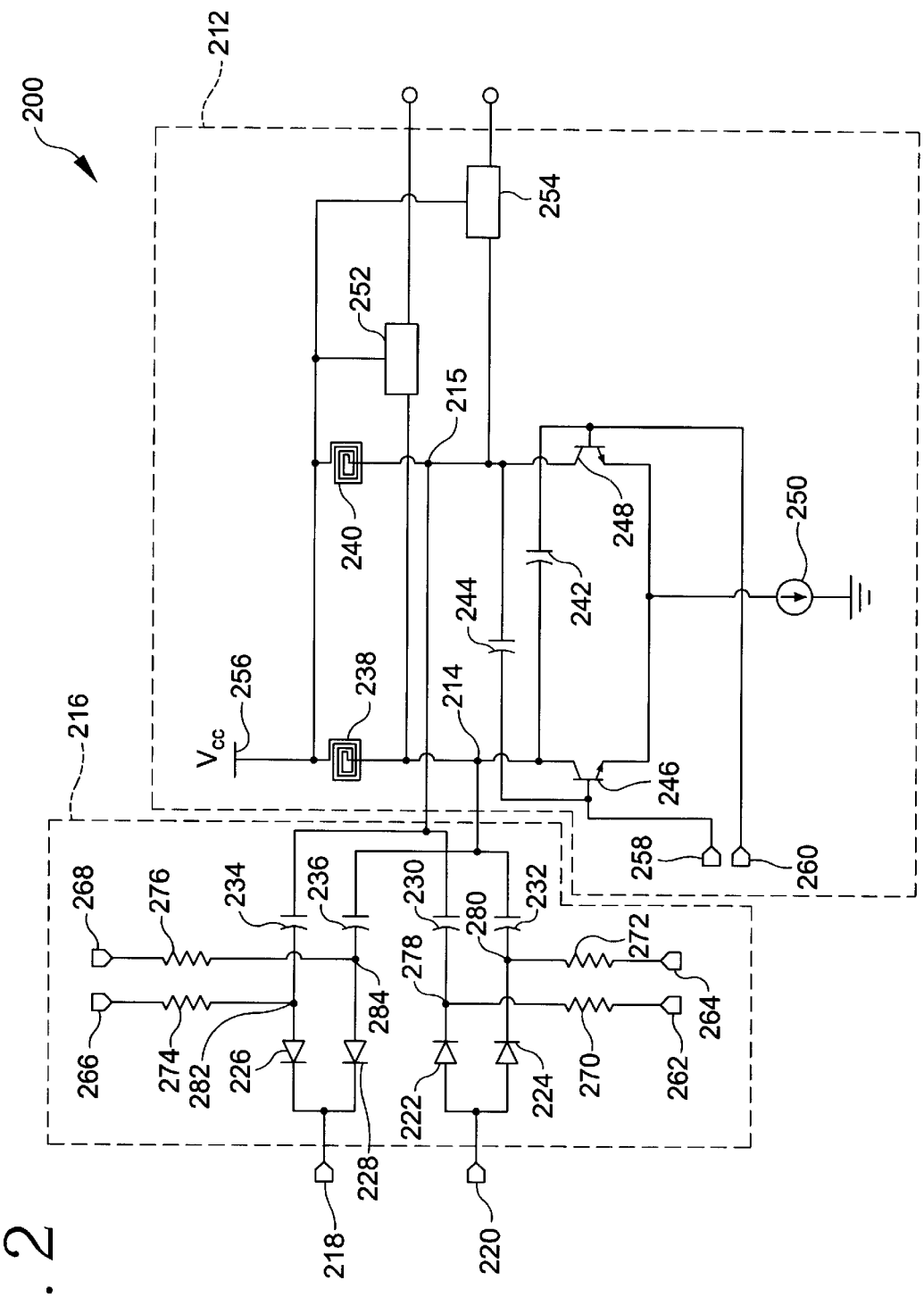
FIG. 2 is a circuit diagram similar to FIG. 1 in which the VDCEs are varactor diodes.

Reference should now be had to FIG. 2 which depicts a preferred embodiment(designated generally as 200) of the present invention, having a topology similar to FIG. 1. Items in FIG. 2 which are similar to those in FIG. 1 have received the same reference numeral incremented by 100. The difference between FIG. 2 and FIG. 1 is as follows: in FIG. 2, the first, second, third and fourth generic VDCEs 122, 124, 126 and 128 of FIG. 1 have been replaced with first, second, third and fourth varactor diodes 222, 224, 226, 228. Each varactor diode has an anode which functions as a corresponding one of the positive VDCE terminals discussed above, and a cathode which functions as a corresponding one of the negative VDCE terminals discussed above.

Figure 3:
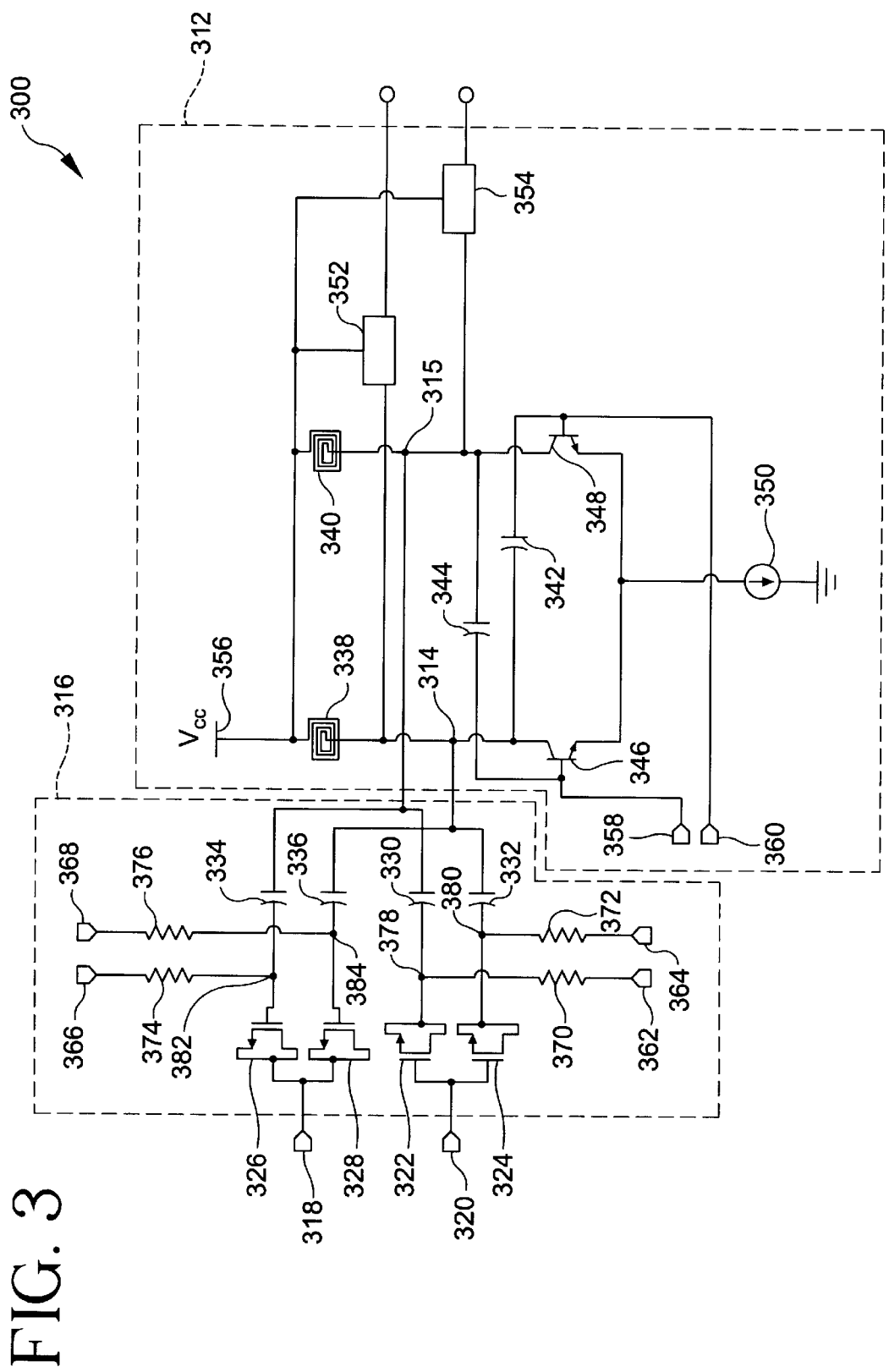
FIG. 3 is a circuit diagram similar to FIG. 1 in which the VDCEs are FETs.

Reference should now be had to FIG. 3, which depicts another embodiment of the present invention (designated generally as 300) having a topology similar to FIGS. 1 and 2, wherein similar items have received a similar reference character to that of FIG. 1 incremented by 200. The difference between the embodiment of FIG. 3 and that shown in FIGS. 1 and 2 is that the generic VDCEs 122, 124, 126 and 128 of FIG. 1 have been replaced in FIG. 3 with field effect transistors (FETs), each of which has a gate which functions as a corresponding one of the positive VDCE terminals and each of which has a drain and source which are shorted together to function as a corresponding one of the negative VDCE terminals. The first, second, third and fourth FETs are numbered, respectively, 322, 324, 326 and 328.

Figure 4:
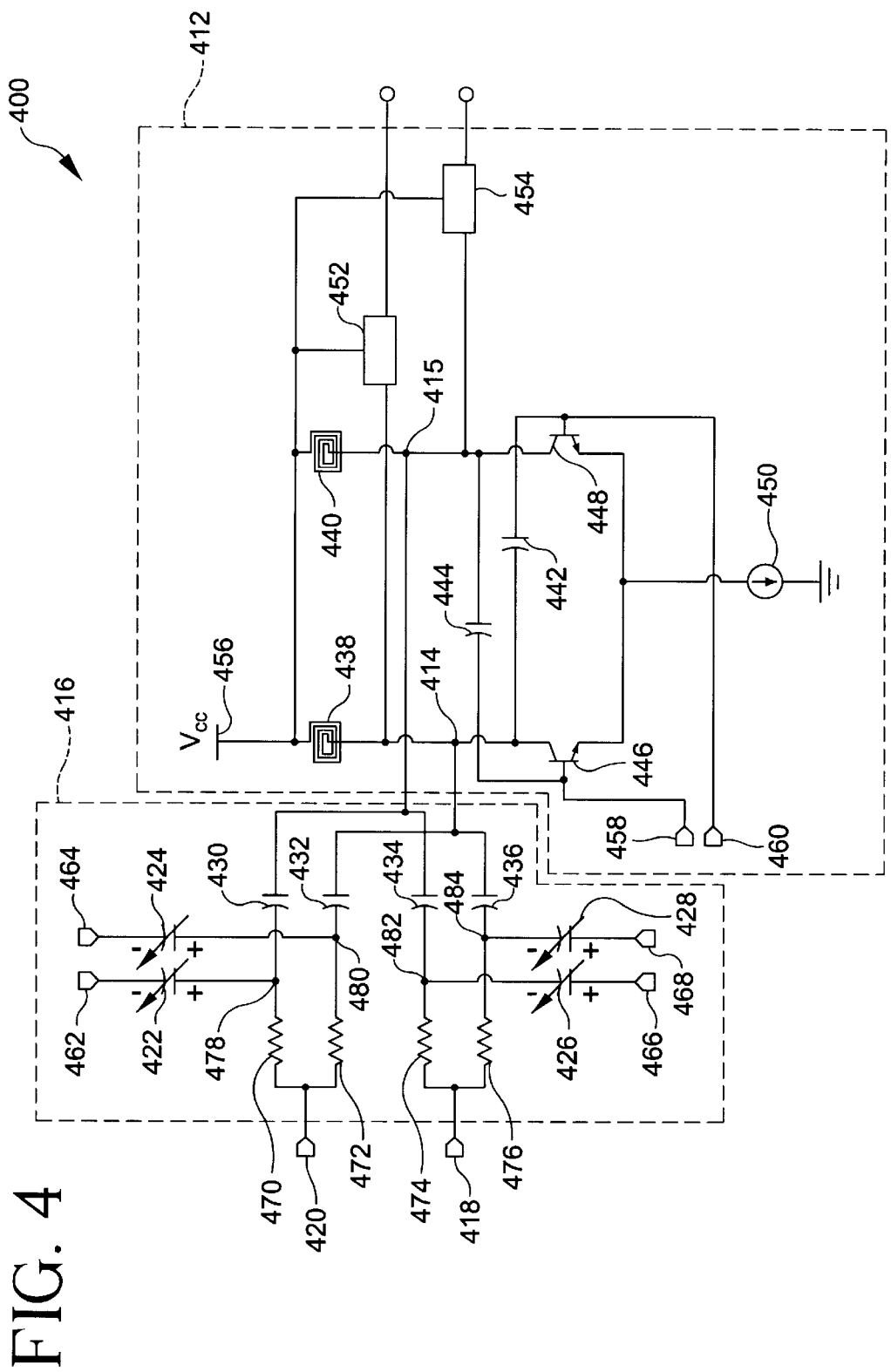
FIG. 4 is a circuit diagram of another LC VCO in accordance with the present invention.

Reference should now be had to FIG. 4, which depicts an embodiment of the present invention having an alternative topology which is somewhat similar to that shown in FIG. 1, but in which the first, second, third and fourth VDCEs have switched places with the first, second, third and fourth resistors. Items in FIG. 4 similar to those in FIG. 1 have received the same reference character incremented by 300. Stated in another way, the first interconnection node 478 includes the positive terminal of the first VDCE 422, and the second interconnection node 480 includes the positive terminal of the second VDCE 424. Further, the third interconnection node 482 includes the negative terminal of the third VDCE 426, and the fourth interconnection node 484 includes the negative terminal of the fourth VDCE 428.

Figure 5:
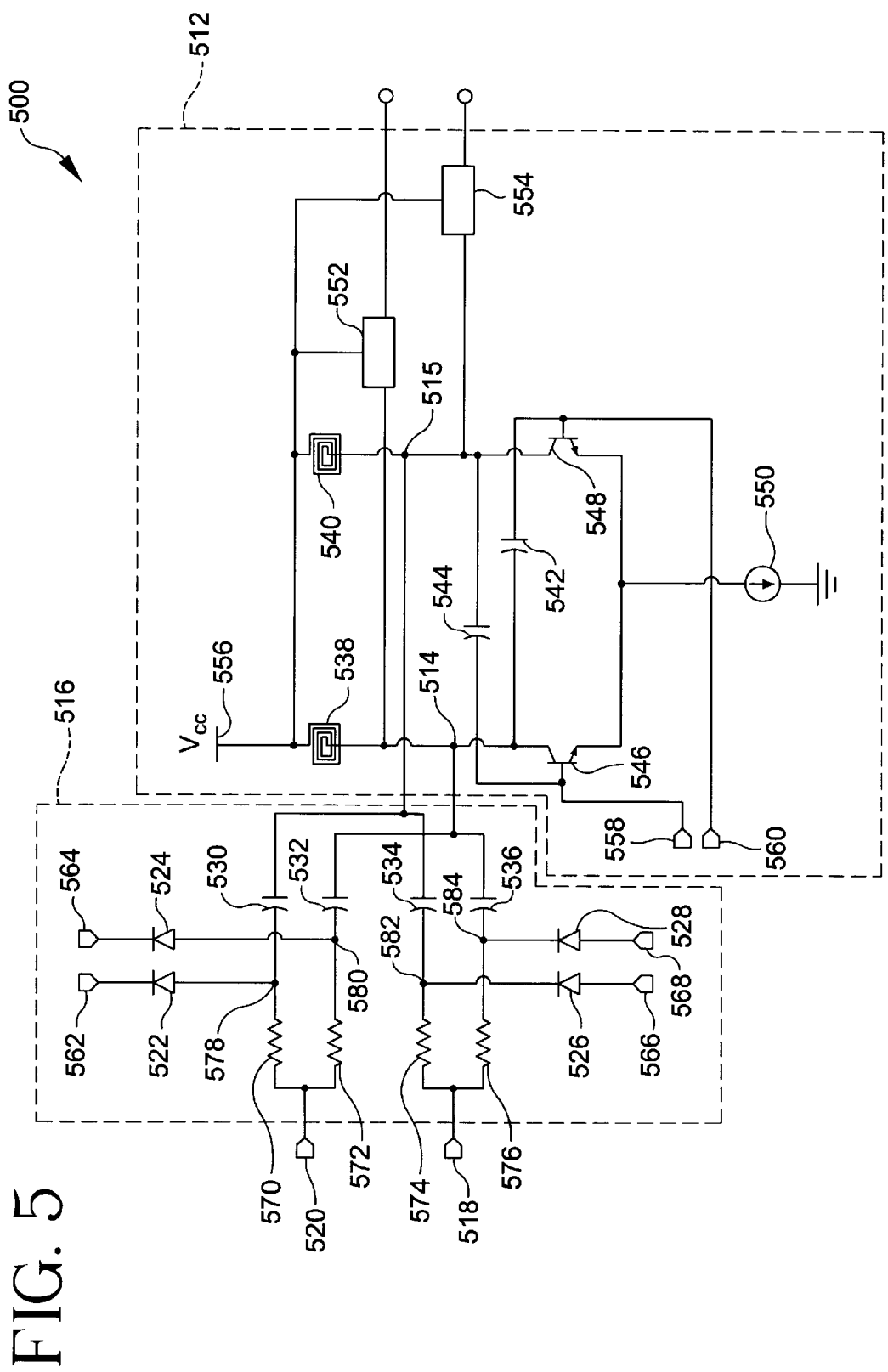
FIG. 5 is a circuit diagram similar to FIG. 4 but wherein the VDCEs are varactor diodes.

Attention should now be given to FIG. 5, which depicts an embodiment of the present invention (designated generally as 500) which has a topology similar to the topology of FIG. 4, wherein the generic VDCEs 422, 424, 426 and 428 of FIG. 4 have been replaced with the varactor diodes 522, 524, 526 and 528 respectively of FIG. 5. Items in FIG. 5 which are similar to those in FIG. 4 have received the same reference character incremented by 100. The varactor diodes 522, 524, 526 and 528 each have an anode which functions as a corresponding one of the positive VDCE terminals and a cathode which functions as a corresponding one of the negative VDCE terminals.

Figure 6:
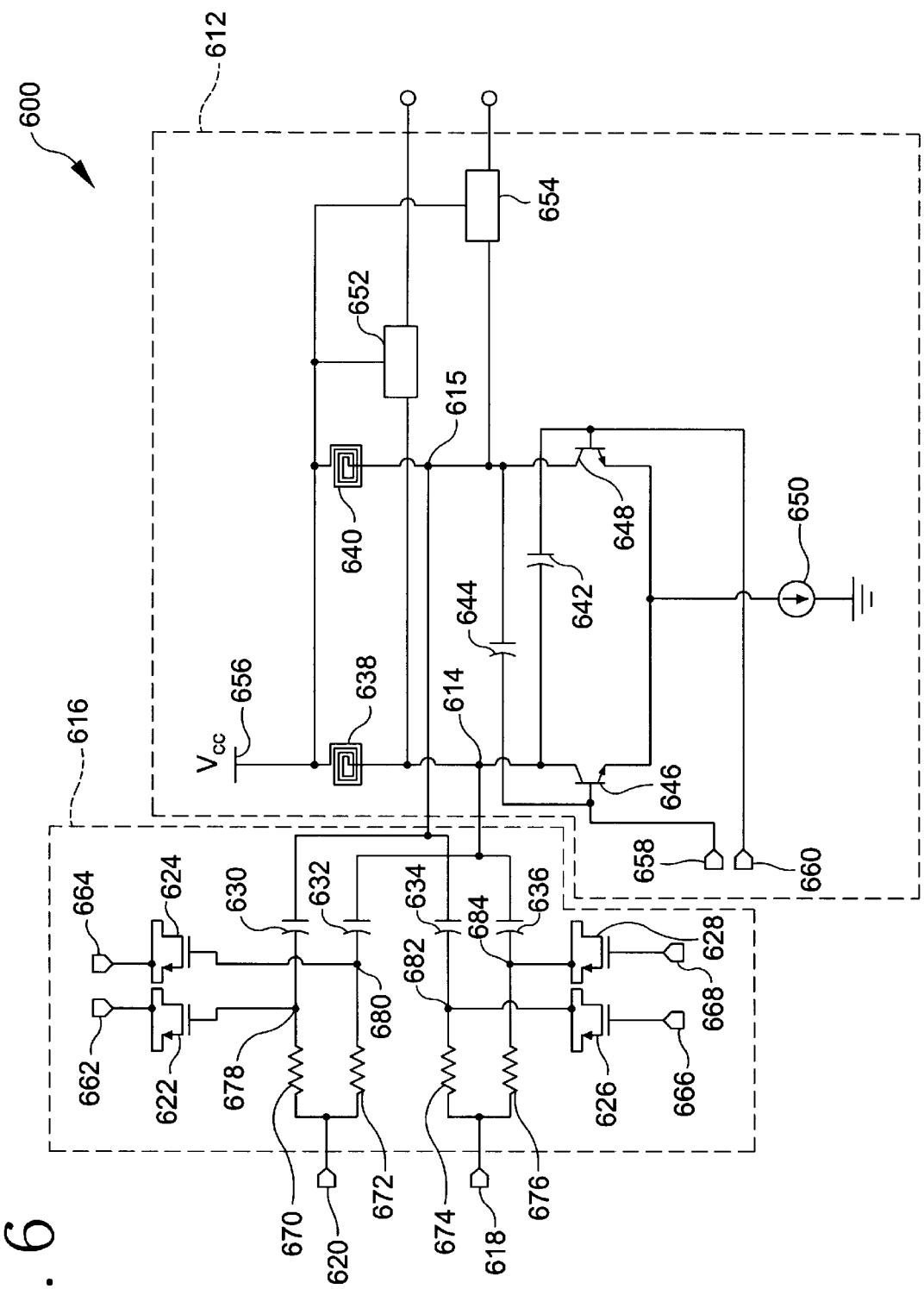
FIG. 6 is a circuit diagram similar to FIG. 4 but wherein the VDCEs are FETs.

Reference should now be given to FIG. 6, which depicts an embodiment of the present invention, designated generally as 600, which has a topology similar to that depicted in FIGS. 4 and 5, wherein the generic VDCEs 422, 424, 426 and 428 of FIG. 4 have been replaced with first, second, third and fourth shorted FETs 622, 624, 626 and 628 respectively. It will be appreciated that the gate of each of the FETs 322, 324, 326, 328 functions as a corresponding one of the positive VDCE terminals and the shorted-together drain and source of FETs 322, 324, 326 and 328 function as a corresponding one of the negative VDCE terminals. Items in FIG. 6 similar to those in FIG. 4 have received the corresponding reference character incremented by 200.

In all the embodiments depicted herein, the coupling capacitors have been shown as part of the respective control modules for illustrative convenience, however, it is to be understood that they may also be thought of as separate components which couple the control modules to the LC oscillator modules.

Proper biasing of the VDCEs, whether implemented as varactor diodes, shorted FETs, or in some other fashion, is important. Such proper biasing enables the expected control input for the LC VCO to be compatible with the output of whatever circuitry will be used to generate the control input. The VDCEs, again including varactor diodes or FETs, should be biased so that a common mode input yields a minimal change in the element capacitance. Ideally, the response of the LC VCO to a common mode input should be such that there is no change in frequency, as the increase in capacitance caused by one of the differential inputs should be canceled by the decrease in capacitance caused by the other differential input. In the illustrative embodiments of the present invention which have been set forth herein, AC coupling (i.e., through the coupling capacitors) between the VDCEs and the tank circuit in the LC oscillator module is employed to help achieve proper biasing, thus allowing definition of the bias point for all terminals of the capacitive elements, as needed, without interfering with the DC operating point of the VCO itself As used herein, a positive control voltage refers to a voltage which is connected to one of the positive input voltage terminals 118, 218, 318, 418, 518, 618 which, when it increases, in turn increases the output frequency of the VCO. Similarly, a negative control voltage is defined as an input to the negative input voltage terminals 120, 220, 320, 420, 520, 620 such that, when it increases, it in turn decreases the VCO output frequency. For purposes of illustration, reference should now be had to the embodiment depicted in FIG. 2. Consider a case when nodes 256, 262 and 264 are maintained at a value of $V_{cc}$=+3.3 volts (DC bias voltage) and nodes 266 and 268 are grounded. Further discussion regarding biasing, and of nodes 256, 262, 264, 266 and 268, is presented hereinbelow, including the "Example" section of the specification. When the positive control voltage applied at terminal 218 increases, the reverse bias of the varactor diodes 226, 228 also increases, thus decreasing the varactor capacitance and increasing the oscillator frequency. However, when the negative control voltage applied at terminal 220 increases, the reverse bias of the varactor diodes 222, 224 decreases, thus increasing the capacitance of varactor diodes 222, 224 and tending to decrease the oscillator frequency. Accordingly, a common mode input to both the positive and negative voltage terminals 118, 120 increases the capacitance in one pair of varactor diodes but decreases it in the other, substantial cancellation is therefore achieved.

While varactor diodes and shorted FETs have been presented herein as examples of VDCEs, it should be appreciated that many other types of circuit elements could be used as the VDCEs. These could include, for example, Schottky diodes, p-type intrinsic n-type (PIN) diodes, accumulation mode varactors, or a controller for a microelectromechanical system (MEMs) structure.

Again referring to FIG. 2, it will be appreciated that the varactor diodes 222, 224, 226 and 228 are reverse-biased, i.e., they are biased so as to be in an "off" position, with the changing input voltages resulting in a changing depletion width; the changing width of the depletion region acts like the insulator in a conventional capacitor. Thus, varactor diodes 222 and 224 are reverse-biased by having their cathodes connected to first and second bias voltage terminals 262, 264 through resistors 270, 272 respectively. First and second bias voltage terminals 262, 264 are typically both connected to a positive supply voltage. Diodes 226, 228 are reverse-biased by having their anodes interconnected with third and fourth bias voltage terminals 266, 268 through third and fourth resistors 274, 276 respectively. Bias voltage terminals 266 and 268 can typically be connected to ground. It should be noted that any suitable scheme for biasing the diodes, or other VDCE elements, can be employed; the arrangements just described are exemplary.

Still with reference to FIG. 2, it will be appreciated that an increase in the positive control voltage applied to the positive input voltage terminal 218, and a concomitant decrease in the negative control voltage applied to the negative input voltage terminal 220 will serve to increase the frequency of tile LC VCO. A common mode input applied to terminals 218, 220 will result in an increased capacitance in one pair of varactor diodes and a decrease in the other pair. Ideally, no change in oscillator output frequency would result, however, because the capacitance versus voltage dependence of a varactor diode is nonlinear, the cancellation may not be perfect, and some change in output frequency may occur. However, in the center of the diode tuning range, the cancellation will be substantial. Even when cancellation is imperfect, the effect of common mode inputs is always mitigated by the control topology of the present invention. It should further be noted that the biasing schemes depicted herein, especially as shown in FIG. 2, enable the inventive control topology to be used with standard differential outputs from logic gates or amplifiers, and no additional supply voltages are required.

Referring now again to FIG. 5, increasing the voltage applied to the positive input voltage terminal 518 will decrease the variable capacitance in the LC tank circuit, and thus increase the oscillator frequency, while increasing the voltage applied to the negative input voltage terminal 520 will increase the variable capacitance in the LC tank circuit, and thus decrease the oscillator frequency. The negative terminals of varactor diodes 522 and 524 are connected to first and second bias voltage terminals 562, 564. Typically, both of terminals 562, 564 may be connected to the positive power supply. The positive terminals of varactor diodes 526, 528 are connected to third and fourth biasing voltage terminals 566, 568, typically, both of these terminals can be tied to the negative power supply or ground.

Reference should now again be had to FIG. 3. It will be appreciated that in the exemplary embodiments shown in FIGS. 3 and 6, the VDCEs are FETs, in particular, n-channel FETs. Those of skill in the art will appreciate that either JFETs or MOSFETs can be employed, further, that embodiments using p-channel FETs could also be constructed by those of skill in the art. In the embodiment shown in FIG. 3, increasing the voltage applied to the positive input voltage terminal 318 decreases the capacitances of FETs 326, 328, thus reducing the capacitance coupled to the LC tank circuit, and thereby increasing the oscillator frequency. Conversely, increasing the negative control voltage applied to the negative input voltage terminal 320 increases the capacitance of FETs 322, 324, thus increasing the capacitance coupled to the LC tank and decreasing the oscillator frequency. Inasmuch as FETs exhibit a highly nonlinear capacitance versus voltage curve, precise control of the permissible positive and negative control voltages applied to terminals 318, 320, and proper setting of the voltages applied to first, second, third and fourth bias voltage terminals 362, 364, 366 and 368 are necessary in order to achieve the desired benefits of the differential topology, in particular, the substantial cancellation of the effects of a common mode input. Similar comments apply to the embodiment of FIG. 5.

Referring again to FIG. 1 and 4, which show the generic VDCEs, it will be appreciated that the greater the degree of linearity exhibited in the behavior of the VDCE, the better will be the differential behavior of the control input. The VDCEs are shown as two-terminal devices, one terminal positive and one terminal negative, as a minimum requirement; devices having more than two terminals could also be employed. In the illustrative embodiments shown, the capacitance of the generic VDCEs increases monotonically with increasing voltage applied to the positive terminal relative to the negative terminal, and decreases monotonically with decreasing voltage applied to the positive terminal with respect to the negative terminal. The positive input voltage terminal 118 receives a positive control input voltage, and is connected to the negative terminals of the VDCEs 126, 128. The positive terminals of VDCEs 126, 128 are connected, through resistors 174, 176 to input voltages applied to the third and fourth bias voltage terminals 166, 168. As discussed above, the negative terminals of VDCEs 122, 124 are connected through resistors 170, 172 to first and second biasing voltage terminals 162, 164. Terminals 166, 168 can typically be connected together, as can terminals 162, 164.

It will thus be appreciated that the present invention enables a fully differential signal path in phase locked loops which employ LC oscillators, thus improving the noise rejection properties of the oscillator. Two voltage controlled capacitive elements are coupled to each LC branch of the LC VCO. For each branch, the change in capacitance which results from a change in the input voltage is of opposite sign between the two voltage controlled capacitive elements. Accordingly, with careful design, common mode noise coupled to the control inputs of the VCO will be substantially suppressed. The invention does not require additional supply voltages, and involves only a minimal increase in complexity over a single-ended control design.

EXAMPLE

Figure 7:
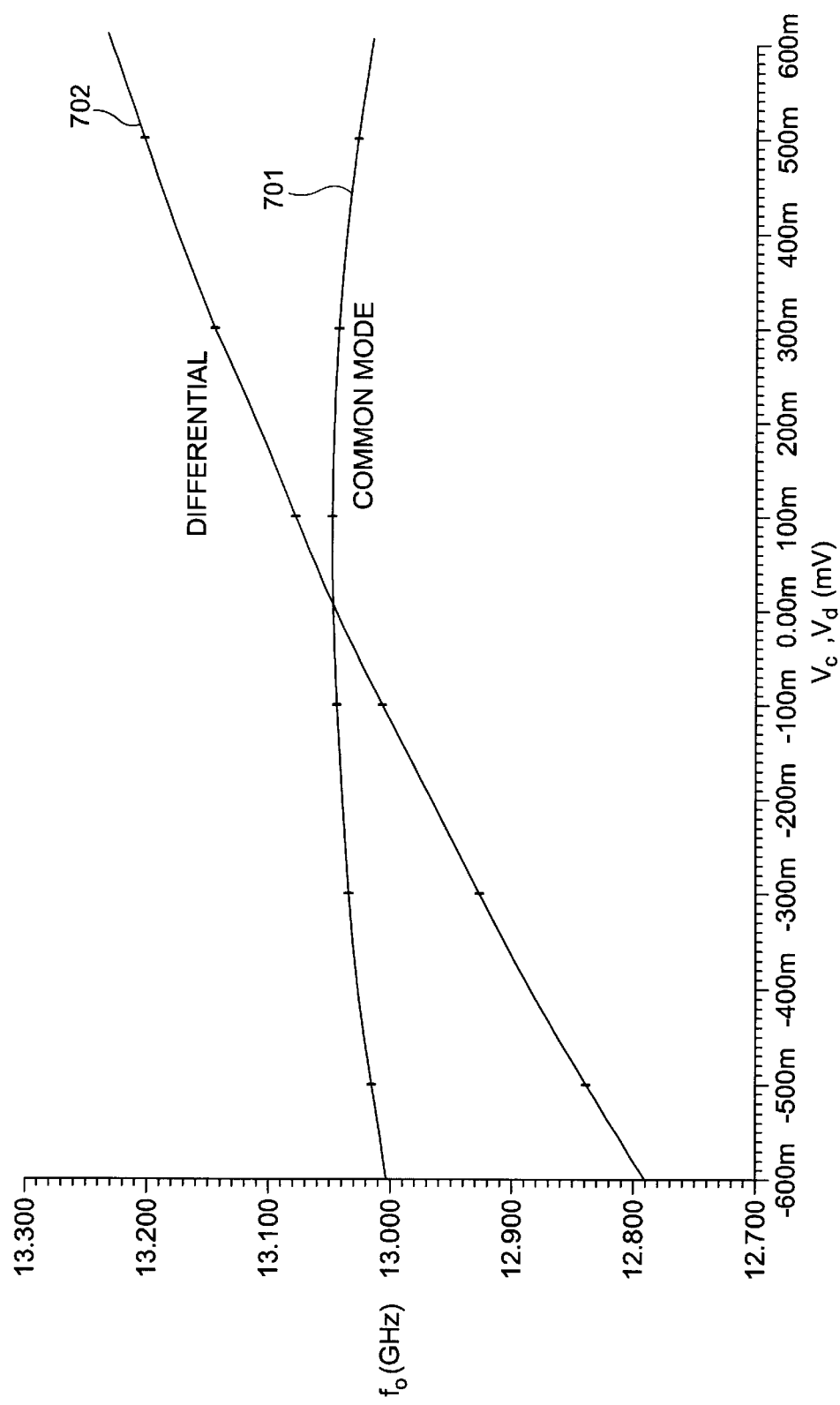
FIG. 7 is a graph depicting the output frequency of an LC VCO of the present invention as a function of the common mode input provided to the input terminals, with a differential mode input over the same voltage range also shown for comparison.

Performance of an LC VCO of the present invention was predicted using the well-known SPECTRE circuit simulator. Results are depicted in FIG. 7. The output frequency, $f_0$ of an inventive LC VCO is shown as a function of a common mode input $V_c$ provided to both input voltage terminals, in curve 701. It will be noted that changes in $V_c$ result in only a minimal change in the output frequency $f_0$. For comparison purposes, curve 702 depicts a differential mode input over the same voltage range applied to the control inputs. Note the substantial linearity of changes in $f_0$ with the applied differential mode input $V_d$. The values for $f_0$ are in GHz, while those for $V_c$ and $V_d$ are in mV.

The curves in FIG. 7 can be generated, for example, for the embodiment depicted in FIG. 2, using the following values. The exemplary values are for operation at a nominal frequency $f_0$ of 12.5 GHz. Nodes 256, 262 and 264 can have an applied DC bias voltage of 3.3 volts. Nodes 266 and 268 can be grounded. Terminals 258, 260 can have an applied DC bias voltage of 2.1 volts. The positive voltage applied to terminal 218 can vary from zero to 3.3 volts, while the concomitant voltage applied to terminal 120 can range from 3.3 volts to zero volts.

The varactor diodes 222, 224, 226 and 228 can each have four collector stripes of length 20 μm and width 2 μm. The resistors 270, 272, 274 and 276 can each have a value of 5 kΩ. The coupling capacitors 230, 232, 234 and 236 can each have a value of 1 pF. The capacitors 242, 244 can each have a value of 100 fF. Inductors 238, 240 can each have a value of 0.34 nH. The current source 250 can supply a current of 10 mA. The BJTs 246, 248 can each be formed as three parallel devices, with each parallel device having an emitter length of 5 μm and an emitter width of 0.5 μm.

It is to be emphasized that the values provided are exemplary, for the preferred embodiment depicted in FIG. 2 operating at 12.5 GHz. Those of skill in the art can select other component values for other configurations, or for operation at different frequencies. Changes in the VCO center frequency can be accomplished by bearing in mind that the frequency is inversely proportional to the square root of the product of LC, where L and C are the total tank node inductance and capacitance, respectively. Thus, increasing the size of the inductors 238, 240 will decrease the frequency, as will increasing the parasitic capacitance, for example, by using a larger varactor diode. Minimizing parasitic capacitances connected to the tank circuit, such as those associated with the series connection to the varactor diodes, is important in preserving tuning range for the VCO; parasitic capacitances must be offset by reducing the size of the variable capacitor.

While there have been described what are presently believed to be the preferred embodiments of the invention, those skilled in the art will realize that various changes and modifications can be made to the invention without departing from the spirit of the invention, and it is intended to claim all such changes and modifications as fall within the scope of the invention.

What is claimed is:

1. An inductive-capacitive (LC) voltage controlled oscillator (VCO) comprising:
    (a) an LC oscillator module having first and second tank nodes; and
    (b) a control module having positive and negative input voltage terminals, said control module in turn comprising:
        (b-1) a first voltage dependent capacitive element (VDCE) having positive and negative VDCE terminals, said positive terminal of said first VDCE being coupled to said negative input voltage terminal, one of said positive and negative terminals of said first VDCE being capacitively coupled to said second tank node, said first VDCE being configured to be biased for operation as a voltage-dependent variable capacitance;
        (b-2) a second VDCE having positive and negative VDCE terminals, said positive terminal of said second VDCE being coupled to said negative input voltage terminal, one of said positive and negative terminals of said second VDCE being capacitively coupled to said first tank node, said second VDCE being configured to be biased for operation as a voltage-dependent variable capacitance;

(b-3) a third VDCE having positive and negative VDCE terminals, said negative terminal of said third VDCE being coupled to said positive input voltage terminal, one of said positive and negative terminals of said third VDCE being capacitively coupled to said second tank node, said third VDCE being configured to be biased for operation as a voltage-dependent variable capacitance; and (b-4) a fourth VDCE having positive and negative VDCE terminals, said negative terminal of said fourth VDCE being coupled to said positive input voltage terminal, one of said positive and negative terminals of said fourth VDCE being capacitively coupled to said first tank node, said fourth VDCE being configured to be biased for operation as a voltage-dependent variable capacitance;

whereby:

a differential voltage applied across said positive and negative input voltage terminals is operable to change capacitive properties of said VDCEs, so as to vary an output frequency of said LC oscillator module, while effects on said output frequency of a common mode voltage applied to said positive and negative input voltage terminals tend to cancel.

2. The LC VCO of claim 1, wherein said control module further comprises:

first, second, third and fourth biasing voltage terminals; and first, second, third and fourth resistors; and wherein:

said negative terminal of said first VDCE is coupled to said first biasing voltage terminal;

said first VDCE and said first resistor are connected at a first interconnection node, and form a first end-to-end coupled RC pair between said negative input voltage terminal and said first biasing voltage terminal, said first interconnection node including said one of said positive and negative terminals of said first VDCE which is capacitively coupled to said second tank node;

said negative terminal of said second VDCE is coupled to said second biasing voltage terminal;

said second VDCE and said second resistor are connected at a second interconnection node, and form a second end-to-end coupled RC pair between said negative input voltage terminal and said second biasing voltage terminal, said second interconnection node including said one of said positive and negative terminals of said second VDCE which is capacitively coupled to said first tank node;

said positive terminal of said third VDCE is coupled to said third biasing voltage terminal, said third VDCE and said third resistor are connected at a third interconnection node, and form a third end-to-end coupled RC pair between said positive input voltage terminal and said third biasing voltage terminal, said third interconnection node including said one of said positive and negative terminals of said third VDCE which is capacitively coupled to said second tank node;

said positive terminal of said fourth VDCE is coupled to said fourth biasing voltage terminal; and said fourth VDCE and said fourth resistor are connected at a fourth interconnection node, and form a fourth end-to-end coupled RC pair between said positive input voltage terminal and said fourth biasing voltage terminal, said fourth interconnection node including said one of said positive and negative terminals of said fourth VDCE which is capacitively coupled to said first tank node.

3. The LC VCO of claim 2, wherein:

said first interconnection node includes said negative terminal of said first VDCE;

said second interconnection node includes said negative terminal of said second VDCE;

said third interconnection node includes said positive terminal of said third VDCE; and said fourth interconnection node includes said positive terminal of said fourth VDCE.

4. The LC VCO of claim 3, wherein said VDCEs comprise varactor diodes, each of said varactor diodes having an anode which functions as a corresponding one of said positive VDCE terminals and a cathode which functions as a corresponding one of said negative VDCE terminals.

5. The LC VCO of claim 3, wherein said VDCEs comprise field effect transistors (FETs), each of said FETs having a gate which functions as a corresponding one of said positive VDCE terminals and a drain and source which are shorted together to function as a corresponding one of said negative VDCE terminals.

6. The LC VCO of claim 2, wherein:

said first interconnection node includes said positive terminal of said first VDCE;

said second interconnection node includes said positive terminal of said second VDCE;

said third interconnection node includes said negative terminal of said third VDCE; and said fourth interconnection node includes said negative terminal of said fourth VDCE.

7. The LC VCO of claim 6, wherein said VDCEs comprise varactor diodes, each of said varactor diodes having an anode which functions as a corresponding one of said positive VDCE terminals and a cathode which functions as a corresponding one of said negative VDCE terminals.

8. The LC VCO of claim 6, wherein said VDCEs comprise field effect transistors (FETs), each of said FETs having a gate which functions as a corresponding one of said positive VDCE terminals and a drain and source which are shorted together to function as a corresponding one of said negative VDCE terminals.

* * * * *